(12) United States Patent
Sugimoto et al.

(10) Patent No.: US 9,823,266 B2
(45) Date of Patent: Nov. 21, 2017

(54) CAPACITIVE PHYSICAL QUANTITY SENSOR

(71) Applicant: DENSO CORPORATION, Kariya, Aichi-pref. (JP)

(72) Inventors: Kiyomasa Sugimoto, Kariya (JP); Minekazu Sakai, Kariya (JP)

(73) Assignee: DENSO CORPORATION, Kariya (JP)

( * ) Notice: Subject to any disclaimer, the term of this patent is extended or adjusted under 35 U.S.C. 154(b) by 110 days.

(21) Appl. No.: 14/890,642

(22) PCT Filed: May 16, 2014

(86) PCT No.: PCT/JP2014/002594
§ 371 (c)(1),
(2) Date: Nov. 12, 2015

(87) PCT Pub. No.: WO2014/192242
PCT Pub. Date: Dec. 4, 2014

(65) Prior Publication Data
US 2016/0131680 A1 May 12, 2016

(30) Foreign Application Priority Data
May 31, 2013 (JP) .................................. 2013-115306

(51) Int. Cl.
*G01P 15/125* (2006.01)
*G01P 15/08* (2006.01)
*B81C 1/00* (2006.01)

(52) U.S. Cl.
CPC ........ *G01P 15/125* (2013.01); *B81C 1/00166* (2013.01); *G01P 15/0802* (2013.01);
(Continued)

(58) Field of Classification Search
CPC ...... G01P 15/02; G01P 15/08; G01P 15/0802; G01P 2015/0805; G01P 2015/0862;
(Continued)

(56) References Cited

U.S. PATENT DOCUMENTS 6,151,966 A 11/2000 Sakai et al.
6,257,061 B1 7/2001 Nonoyama et al.
(Continued)

FOREIGN PATENT DOCUMENTS

JP 2010-223640 10/2010
JP 2012-002752 A 1/2012
(Continued)

OTHER PUBLICATIONS

U.S. Appl. No. 14/766,152, filed Aug. 6, 2015, Endo.
(Continued)

*Primary Examiner* — Benjamin Schmitt
(74) *Attorney, Agent, or Firm* — Posz Law Group, PLC

(57) ABSTRACT

A capacitive physical quantity sensor includes a first substrate, a movable electrode, a fixed electrode, and a second substrate. An auxiliary electrode is disposed on a portion of the second substrate to face the movable electrode and the auxiliary electrode has a facing area that faces the movable electrode. The facing area in a case where the movable electrode is displaced in one direction is different from the facing area in a case where the movable electrode is displaced in an opposite direction opposite to the one direction. The physical quantity is detected based on a capacitance, which is generated corresponding to the interval between the fixed electrode and the movable electrode, and a capacitance, which is generated corresponding to an interval between the facing area of the movable electrode and the auxiliary electrode.

9 Claims, 10 Drawing Sheets

(52) U.S. Cl.
CPC ............... *B81B 2201/0235* (2013.01); *B81B 2203/051* (2013.01); *G01P 2015/088* (2013.01); *G01P 2015/0814* (2013.01)

(58) Field of Classification Search
CPC .......... G01P 15/125; B81B 2201/0235; B81B 2203/04; B81C 1/00166
USPC ............... 73/514.01, 514.16, 514.21, 514.32
See application file for complete search history.

(56) References Cited

U.S. PATENT DOCUMENTS

| | | | |
|---|---|---|---|
| 8,100,012 B2 | 1/2012 | Martin et al. | |
| 2011/0203372 A1 | 8/2011 | Foster | |
| 2012/0167685 A1 | 7/2012 | Guo et al. | |
| 2013/0263663 A1* | 10/2013 | Zhang | B81B 7/02 73/504.12 |
| 2013/0346015 A1 | 12/2013 | Yamanaka et al. | |
| 2015/0276615 A1 | 10/2015 | Sugiura et al. | |
| 2015/0381030 A1 | 12/2015 | Endo | |

FOREIGN PATENT DOCUMENTS

| | | | | |
|---|---|---|---|---|
| JP | 2012-177563 | | 9/2012 | |
| JP | 2012177563 A | * | 9/2012 | ............ G01P 15/125 |
| JP | 2012-202696 A | | 10/2012 | |
| WO | 2014/171128 A1 | | 10/2014 | |

OTHER PUBLICATIONS

International Search Report of International Searching Authority dated Jul. 8, 2014 in corresponding PCT application No. PCT/JP2014/002594 (with English translation).
Written Opinion of International Searching Authority dated Jul. 8, 2014 in corresponding PCT application No. PCT/JP2014/002594 (with English translation).

* cited by examiner

CAPACITIVE PHYSICAL QUANTITY SENSOR

CROSS REFERENCE TO RELATED APPLICATIONS

This application is a U.S. national stage application of International Application no. PCT/JP2014/002594 filed on May 16, 2014 and is based on Japanese Patent Application No. 2013-115306 filed May 31, 2013, the disclosures of which are incorporated herein by reference.

TECHNICAL FIELD

The present disclosure relates to a capacitive physical quantity sensor.

BACKGROUND ART

UP to now, as a capacitive physical quantity sensor that outputs a capacitance changing corresponding to a physical quantity as a sensor signal, an acceleration sensor that outputs a sensor signal corresponding to acceleration has been proposed (for example, refer to Patent Literature 1).

Specifically, the acceleration sensor includes a silicon on insulator (SOI) substrate on which a support layer, an insulating film, and a semiconductor layer are laminated on each other in order. The semiconductor layer includes a movable electrode that is displaced corresponding to the acceleration, and a fixed electrode that is disposed to facing the movable electrode to produce a predetermined capacitance in cooperation with the movable electrode.

In the above-described acceleration sensor, when the acceleration is applied to the sensor, the movable electrode is displaced corresponding to the acceleration, and an interval between the movable electrode and the fixed electrode changes. For that reason, the acceleration is detected on the basis of the capacitance between the movable electrode and the fixed electrode.

However, in recent years, there is a demand to further improve a detection sensitivity. In the above description, an acceleration sensor is described as an example of the capacitive physical quantity sensor. Similarly, there is the same demand, for example, in an angular velocity sensor having a movable electrode displaced corresponding to an angular velocity.

PRIOR ART LITERATURES

Patent Literature

Patent Literature 1: JP H11-326365 A

SUMMARY OF INVENTION

In view of the foregoing difficulties, it is an object of the present disclosure to provide a capacitive physical quantity sensor that provides an improved detection sensitivity.

According to an aspect of the present disclosure, a capacitive physical quantity sensor includes a first substrate, a movable electrode, a fixed electrode, and a second electrode. The first substrate has one surface. The movable electrode is disposed on the one surface side of the first substrate, and displaceable in a predetermined direction along a surface direction of the one surface in response to an application of a physical quantity. The fixed electrode is disposed on the one surface side of the first substrate and faces the movable electrode. An interval between the fixed electrode and the movable electrode changes with a displacement of the movable electrode. The second substrate is joined with the first substrate.

An auxiliary electrode is disposed at a portion of the second substrate which faces the movable electrode. The auxiliary electrode is different in a variation of a facing area with the movable electrode in a case where the movable electrode is displaced in one direction of the predetermined direction from a case where the movable electrode is displaced in a direction opposite to the one direction. The capacitive physical quantity sensor detects the physical quantity on the basis of a capacitance corresponding to the interval between the movable electrode and the fixed electrode, and a capacitance corresponding to the facing area of the movable electrode and the auxiliary electrode.

The above capacitive physical quantity sensor detects the physical quantity on the basis of the capacitance corresponding to the interval between the movable electrode and the fixed electrode, and the capacitance corresponding to the facing area of the movable electrode and the auxiliary electrode. Thus, the detection sensitivity can be improved. The auxiliary electrode is disposed so that the variation of the facing area with the movable electrode is different in the case where the movable electrode is deviated in the one direction of the predetermined direction from the case where the movable electrode is deviated in the opposite direction. Thus, a displacement direction of the movable electrode can be easily determined.

BRIEF DESCRIPTION OF DRAWINGS

The above and other objects, features and advantages of the present invention will become more apparent from the following detailed description made with reference to the accompanying drawings. In the drawings.

EMBODIMENTS FOR CARRYING OUT INVENTION

Figure 1:
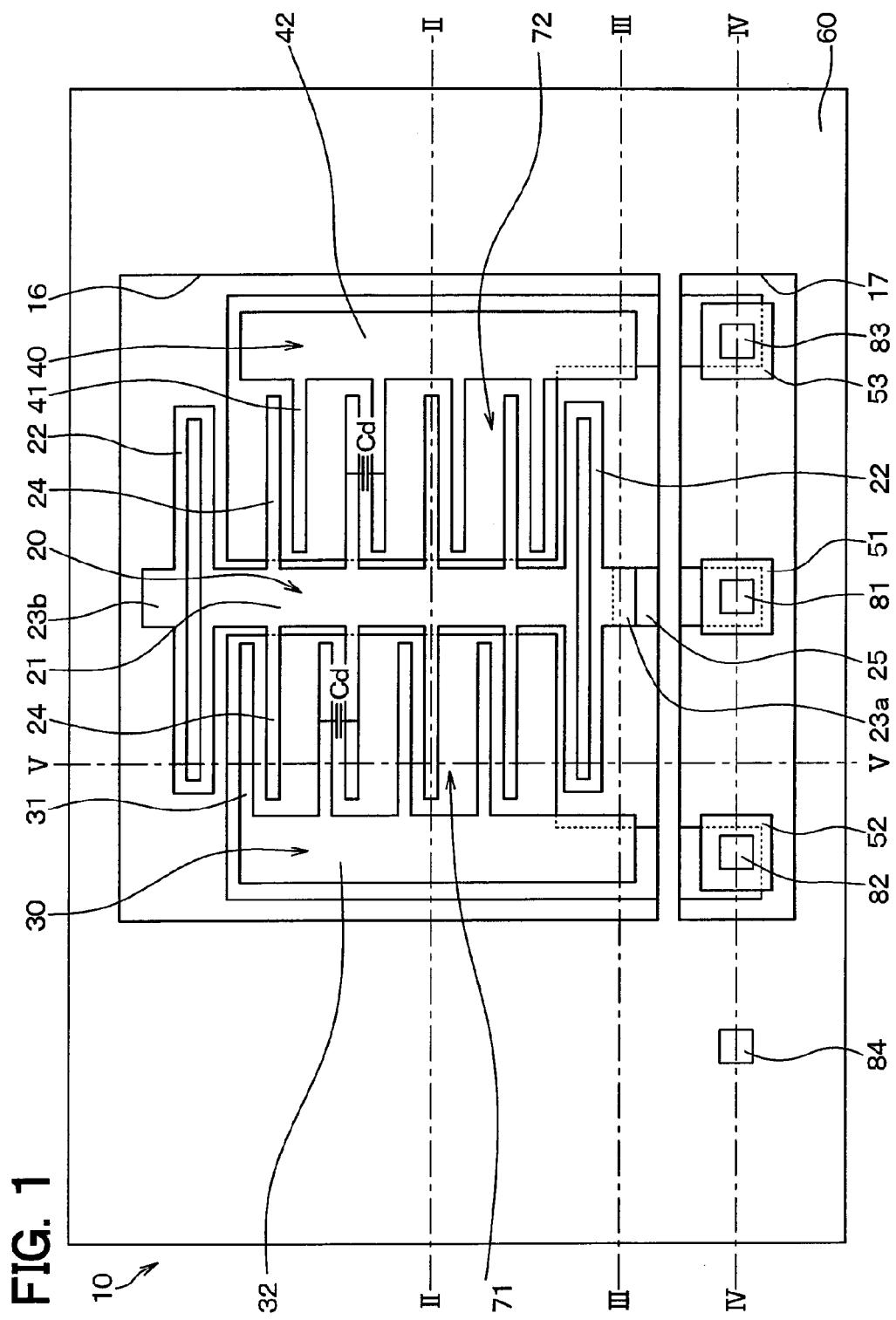
FIG. 1 is a diagram showing a top view of a sensor part of an acceleration sensor according to a first embodiment of the present disclosure.
Figure 2:
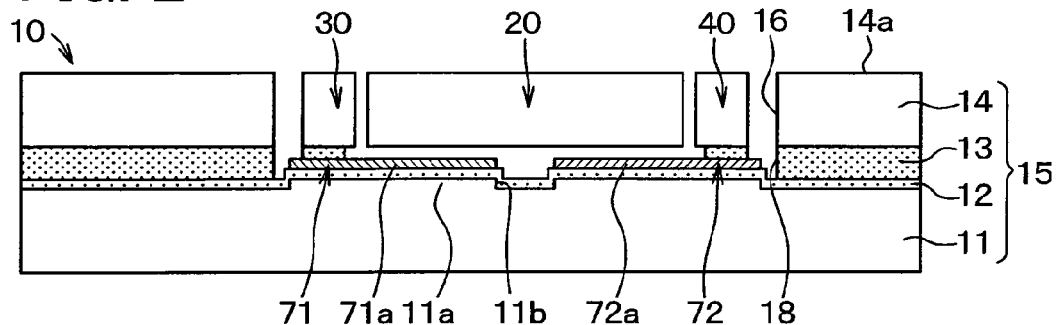
FIG. 2 is a diagram showing a cross-sectional view of the sensor part taken along a line II-II in FIG. 1.

Embodiments of the present disclosure will be described below with reference to the drawings. In the following respective embodiments, parts identical with or equivalent to each other are denoted by the same symbols for description.

First Embodiment

A first embodiment of the present disclosure will be described with reference to the drawings. The present embodiment will describe a capacitive acceleration sensor, which have a capacity changing corresponding to acceleration, as an example of a capacitive physical quantity sensor.

As illustrated in FIGS. 1 to 5, the acceleration sensor includes a sensor part 10 provided with a substrate 15. In the substrate 15, a semiconductor layer 14 is disposed over a support layer 11 sandwiching a first insulating film 12 and a second insulating film 13 therebetween.

In the present embodiment, the semiconductor layer 14 corresponds to a first substrate of the present disclosure, and the support layer 11 corresponds to a second substrate of the present disclosure. The support layer 11 is provided by, for example, a silicon substrate. The first and second insulating films 12 and 13 are made of $SiO_2$ or SiN. The semiconductor layer 14 is made of silicon or polysilicon.

In the semiconductor layer 14, a movable part 20, a first fixed portion 30, and a second fixed portion 40 are partitioned on one surface 14a by a first groove portion 16. In the semiconductor layer 14, connection parts 51 to 53 are partitioned by a second groove portion 17. A portion of the semiconductor layer 14, which is not partitioned by the first and second groove portions 16 and 17, provides a peripheral part 60. The one surface 14a of the semiconductor layer 14 means a surface opposite to the second insulating film 13, and the one surface 14a of the semiconductor layer 14 corresponds to one surface of the first substrate in the present disclosure.

The movable part 20 is configured such that both ends of a rectangular weight part 21 in a longitudinal direction are coupled integrally with anchor parts 23a and 23b through respective beam parts 22.

The anchor parts 23a and 23b are supported on the support layer 11 through the first and second insulating films 12 and 13 within the first groove portion 16. In the second insulating film 13, a portion facing the movable part 20 and portions facing first and second fixed electrodes 31 and 41 are removed to define an opening 18. The first and second fixed electrodes 31 and 41 will be described later. The movable part 20 and the first and second fixed electrodes 31 and 41 are disposed to float over the support layer 11 without being contact.

Each of the beam parts 22 has a rectangular frame shape. The rectangular frame includes two parallel beams coupled with each other at both ends of the beams, and has a spring function so that the beam part 22 is displaced in a direction perpendicular to a longitudinal direction of the two beams. Specifically, when receiving acceleration including a component in a longitudinal direction of the weight part 21, the beam parts 22 displace the weight part 21 in the longitudinal direction, and restore the weight part 21 to an initial state corresponding to a loss of acceleration. Therefore, the weight part 21 coupled to the support layer 11 through the beam parts 22 can be displaced in a displacement direction (longitudinal direction of the weight part 21) of the beam parts 22 corresponding to the acceleration applied to the sensor.

The movable part 20 includes multiple movable electrodes 24 each having a rectangular cross-section. The multiple movable electrodes 24 are protruded integrally from both side surfaces of the weight part 21 in a direction perpendicular to the longitudinal direction of the weight part 21. The movable electrodes 24 protruded from one side surface of the weight part 21 extend in an opposite direction from the movable electrodes 24 protruded from the other side surface of the weight part 21. Referring to FIG. 1, the four movable electrodes 24 are protruded from a left side of the weight part 21, and four movable electrodes 24 are protruded a right side of the weight part 21, and each movable electrode 2a faces the opening 18. The multiple movable electrodes 24, the weight part 21, and the beam parts 22 are formed integrally as one piece. When the beam parts 22 are displaced, the multiple movable electrodes 24, the weight part 21, and the beam parts 22 are displaced in the displacement direction of the beam parts 22 (longitudinal direction of the weight part 21).

The movable part 20 is connected to a connection part 51 through a movable wire 25. Specifically, the movable wire 25 is made of a metal film such as polysilicon or aluminum, and extends from a portion located immediately below the anchor part 23a to a portion located immediately below the connection part 51 in the first insulating film 12. The anchor part 23a (movable part 20) and the connection part 51 are connected to the movable wire 25 through a contact hole 13a defined in the second insulating film 13.

The first fixed portion 30 includes a first support part 32 which is supported by the support layer 11 through the first and second insulating films 12 and 13, and the second fixed portion 40 includes a second support part 42 which is supported by the support layer 11 through the first and second insulating films 12, 13. The first fixed portion 30 includes first fixed electrodes 31 each of which has a rectangular cross-section and is connected to the first support part 32. The second fixed portion 40 includes second fixed electrodes 41 each of which has a rectangular cross-section and is connected to the second support part 42. Specifically, the first and second fixed electrodes 31 and 41 are disposed at predetermined detection intervals from side surfaces of respective movable electrodes 24. The first and second fixed electrodes 31 and 41 are supported by the first and second support parts 32 and 42, respectively, and have comb shapes so as to be engaged with comb-shaped movable electrodes 24. The first and second fixed electrodes 31 and 41 face the opening 18.

When no acceleration is applied to the sensor, the intervals between the movable electrodes 24, and the first and second fixed electrodes 31 and 41 are kept equal to each other. In this case, as indicated by capacitor signs in FIG. 1, respective capacitances $C_d$ are produced between the movable electrodes 24, and the first and second fixed electrodes 31 and 41.

When the movable part 20 is displaced in the longitudinal direction of the weight part 21, displacements of the movable electrodes 24 corresponding to the first fixed electrodes 31 are opposite to the displacements of the movable electrodes 24 corresponding to the second fixed electrodes 41. For example, in the case where the interval between the movable electrodes 24 and the first fixed electrode 31 becomes smaller corresponding to a displacement of the movable electrodes 24, the interval between the movable electrodes 24 and the second fixed electrode 41 becomes larger. Referring to FIG. 1, on the drawing sheet surface, the first fixed electrode 31 is disposed on an upper side with respect to the corresponding movable electrodes 24, and the second fixed electrode 41 is disposed on a lower side with respect to the corresponding movable electrodes 24.

The first and second fixed portions 30 and 40 are disposed to sandwich the weight part 21 between the first and second fixed portions 30 and 40. Referring to FIG. 1, on the drawing sheet surface, the first fixed portion 30 is disposed on a left side with respect to the movable part 20, and the second fixed portion 40 is disposed on a right side with respect to the movable part 20.

Each of first and second auxiliary electrodes 71a and 72a faces only partial portion of the corresponding movable electrode 24 and generating a capacitances $C_s$ between the corresponding movable electrode 24. Each of first and second auxiliary electrodes 71a and 72a is disposed in a portion of the first insulating film 12 from which the second insulating film 13 is removed (refer to FIG. 6). The first and second auxiliary electrodes 71a and 72a are provided by partial portion of first and second wiring parts 71 and 72, which are disposed on the first insulating film 12. Hereinafter, a configuration of the first and second auxiliary electrodes 71a and 72a according to the present embodiment will be described in detail.

A protruded portion 11a is defined in the support layer 11 to be protruded in a normal direction of the one surface of the substrate in the vicinity of a portion facing each of the movable electrodes 24. In other words, in the support layer 11, a recessed portion 11b is defined in one surface of the first insulating film 12 side so as to define the protruded portion 11a.

The protruded portion 11a may be defined in a portion facing each of the movable electrodes 24. In the present embodiment, each protruded portion 11a is defined facing a space between the movable electrode 24 and corresponding one of the first or second fixed electrode 31 or 41. Herein, the movable electrode 24 and the corresponding one of the first or second fixed electrode 31 or 41 generate the capacitances $C_d$.

The first wiring parts 71 are disposed in partial portion of the first insulating film 12 so that the first wiring parts 71 face the movable electrodes 24 and the first fixed electrodes 31. Similarly, the second wiring parts 72 are disposed in partial portion of the first insulating film 12 so that the second wiring parts 72 face the movable electrodes 24 and the second fixed electrodes 41. Those first and second wiring parts 71 and 72 are also disposed on a wall surface and a tip end surface of the protruded portion 11a. The tip end surface is an end surface in a protrusion direction of the protruded portion 11a. In the protrusion direction of the protruded portion 11a, the interval between the tip end surface of the protruded portion 11a and the movable electrode 24 is smaller an interval between another part of the protruded portion 11a and the movable electrode 24. In other words, the protruded portions 11a are disposed so that the intervals between partial portions of the first and second wiring parts 71, 72 and the movable electrodes 24 become smaller than intervals between remaining portions of the first and second wiring parts 71, 72 and the movable electrodes 24.

Intervals between the portions of the first and second wiring parts 71 and 72, which are disposed on the tip end surface of the protruded portion 11a through the first insulating film 12, and the movable electrodes 24 are smaller than the intervals between the portions of the first and second wiring parts 71 and 72, which are disposed on a bottom of the recessed portion 11b through the first insulating film 12, and the movable electrodes 24. Thus, the capacitance between the portions of the first and second wiring parts 71 and 72, which are disposed on the tip end surface of the protruded portion 11a through the first insulating film 12, and the movable electrodes 24 have a substantially large value. Thus, the capacitances Cs are configured between portions of the first and second wiring parts 71 and 72, which have smaller intervals from the movable electrodes 24, and the movable electrodes 24. In the present embodiment, portions of the first and second wiring parts 71 and 72 in which the intervals from the movable electrodes 24 become smaller provide the first and second auxiliary electrodes 71a and 72a.

Figure 6:
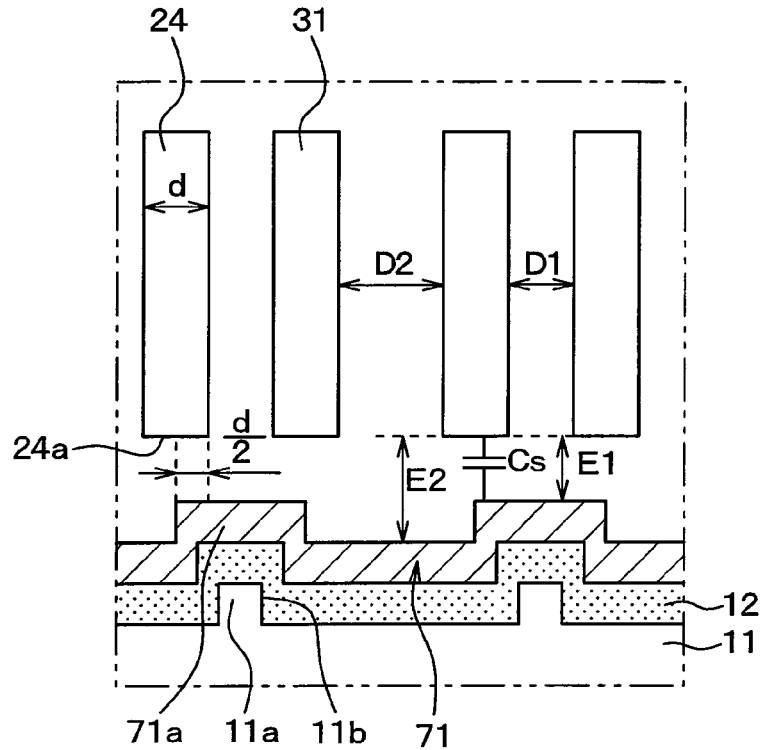
FIG. 6 is a diagram showing an enlarged view of a region A shown in FIG. 5.

As described above, the movable electrodes 24 and the first fixed electrodes 31 are alternately (in a pectinate shape) arranged. A surface of each movable electrode 24 disposed on the support layer 11 side is defined as a lower surface 24a of the movable electrode 24. In the present embodiment, as illustrated in FIG. 6, when no acceleration is applied to the sensor, the first auxiliary electrode 71a is disposed facing a part of the lower surface 24a of the movable electrode. Herein, the part of the lower surface 24a of the movable electrode 24 facing the first auxiliary electrode 71a is disposed close to the corresponding first fixed electrode 31, between which the interval from the movable electrode 24 becomes smaller when the movable electrode 24 is displaced. Specifically, the first auxiliary electrode 71a is disposed to face only partial region of the lower surface 24a which is disposed on the corresponding first fixed electrode 31 side when the lower surface 24a is divided into two regions in a direction perpendicular to the displacement direction of the movable electrode 24. Herein, the corresponding first fixed electrode 31 is the electrode with which the interval from the movable electrode 24 becomes smaller when the movable electrode 24 is displaced. When that the movable electrode 24 has a width d, a half part of the movable electrode which is disposed close to the corresponding first fixed electrode 31 has a width of d/2. Herein, the corresponding first fixed electrode 31 is the electrode with which the interval from the movable electrode 24 becomes smaller when the movable electrode 24 is displaced. As an example, the first auxiliary electrode 71a may face the half part of the lower surface 24a of the movable electrode 24 which is disposed close to the corresponding first fixed electrode 31.

Although not particularly shown, the second auxiliary electrode 72a has similar configuration as that of the first auxiliary electrode 71a. In other words, in the case where no acceleration is applied to the sensor, the second auxiliary electrode 72a is disposed to face only partial region of the lower surface 24a which is disposed on the corresponding second fixed electrode 41 side when the lower surface 24a is divided into two regions in a direction perpendicular to the displacement direction of the movable electrode 24. Herein, the corresponding second fixed electrode 41 is the electrode with which the interval from the movable electrode 24 becomes smaller when the movable electrode 24 is displaced.

For example, when the movable electrodes 24 are displaced to an upper side (toward the anchor part 23b) on the drawing sheet of FIG. 1, the facing area between the first auxiliary electrode 71a and the movable electrode 24 corresponding to the first fixed electrode 31 increases, and the facing area between the second auxiliary electrode 72a and the movable electrode 24 corresponding to the second fixed electrode 41 decreases.

An interval E1 between the movable electrode 24 and the first auxiliary electrode 71a may be set to be equal to an interval D1 between the movable electrode 24 and the corresponding first fixed electrode 31. Herein, the corresponding first fixed electrode 31 is the first fixed electrode 31 which approaches the movable electrode 24 when the movable electrode 24 is displaced. An interval E2 between the movable electrode 24 and a portion of the first wiring part 71 which is different from a portion configuring the first auxiliary electrode 71a is set to be equal to an interval D2 between the movable electrode 24 and the non-corresponding first fixed electrodes 31. Herein, the non-corresponding first fixed electrode 31 is the first fixed electrode which moves away from the movable electrode 24 when the movable electrode 24 is displaced.

The portion of the first wiring part 71 which is different from the portion configuring the first auxiliary electrode 71a means a portion of the first wiring part 71 which is disposed over the bottom of the recessed portion 11b through the first insulating film 12. Although not particularly shown, the interval E1 between the lower surface 24a of the movable electrode 24 and the second auxiliary electrode 72a is set to be equal to the interval D1 between the movable electrode 24 and the corresponding second fixed electrode 41. Herein, the corresponding second fixed electrode 41 is the second fixed electrode 31 which approaches the movable electrode 24 when the movable electrode 24 is displaced. The interval E2 between the portion of the second wiring part 72, which is different from the second auxiliary electrode 72a, and the movable electrode 24 is set to be equal to the interval D2 between the movable electrode 24 and the non-corresponding second fixed electrode 41. Herein, the non-corresponding second fixed electrode 41 is the second fixed electrode which moves away from the movable electrode 24 when the movable electrode 24 is displaced.

As illustrated in FIG. 1, the first and second wiring parts 71 and 72 pass through a portion of the first insulating film 12 which faces the first support part 32, and extend to immediately below the connection part 52. The second wiring part 72 passes through a portion of the first insulating film 12 facing the second support part 42, and extend to immediately below the connection portion 53.

Figure 3:
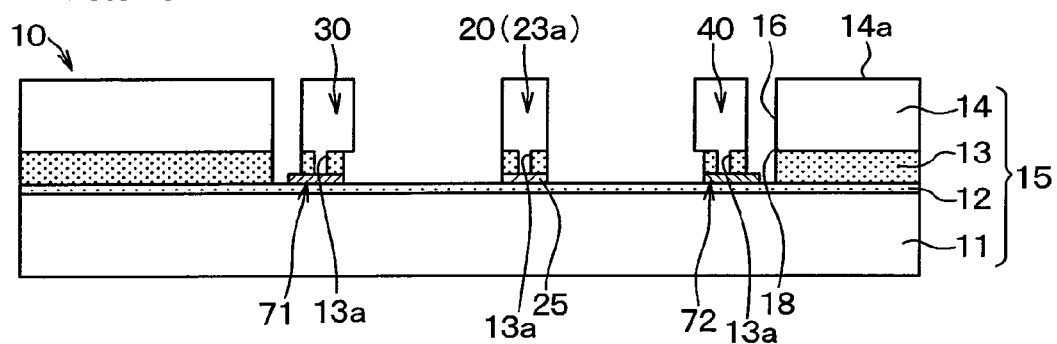
FIG. 3 is a diagram showing a cross-sectional view of the sensor part taken along a line in FIG. 1.
Figure 4:
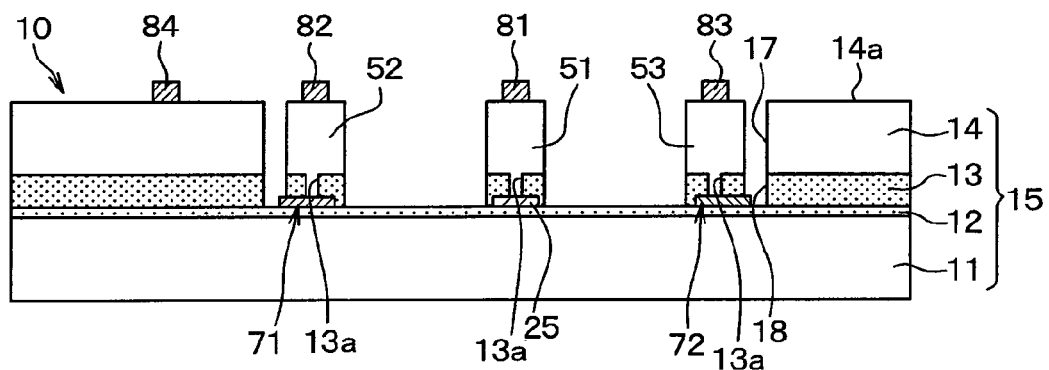
FIG. 4 is a diagram showing a cross-sectional view of the sensor part taken along a line IV-IV in FIG. 1.
Figure 5:
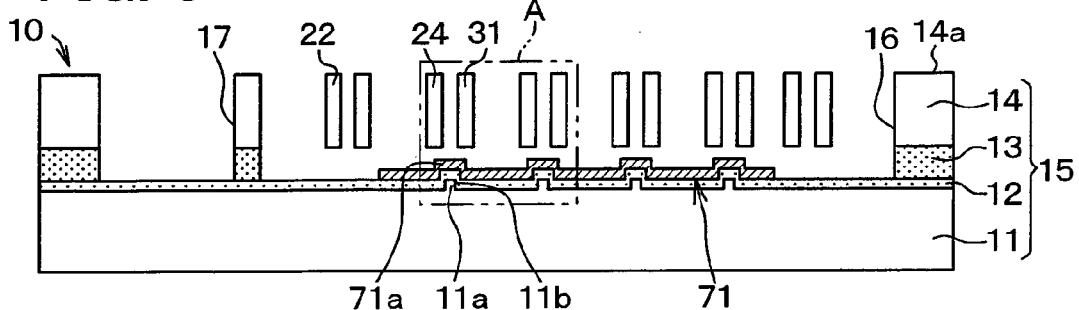
FIG. 5 is a diagram showing a cross-sectional view of the sensor part taken along a line V-V in FIG. 1.

As illustrated in FIG. 4, the connection parts 52 and 53 are, respectively, connected to the first and second wiring parts 71 and 72 through the contact holes 13a defined in the second insulating film 13. Likewise, as illustrated in FIG. 3, the first and second support parts 32 and 42 are, respectively, connected to the first and second wiring parts 71 and 72 through the contact holes 13a defined in the second insulating film 13. In other words, in the present embodiment, the first fixed electrodes 31 and the first auxiliary electrode 71a (provided by partial portion of the first wiring part 71) have the same potential, and the second fixed electrodes 41 and the second auxiliary electrode 72a (provided by partial portion of the second wiring part 72) have the same potential.

As illustrated in FIG. 4, pads 81 to 84 are disposed on the connection parts 51 to 53 and the peripheral part 60 in the semiconductor layer 14. The connection parts 51 to 53 and the peripheral part 60 are electrically connected to a circuit 100 through the pads 81 to 84 and wires. The circuit 100A provides a predetermined potential to the pad 84 disposed on the peripheral part 60 for the purpose of fixing a potential of the peripheral part 60.

Figure 7:
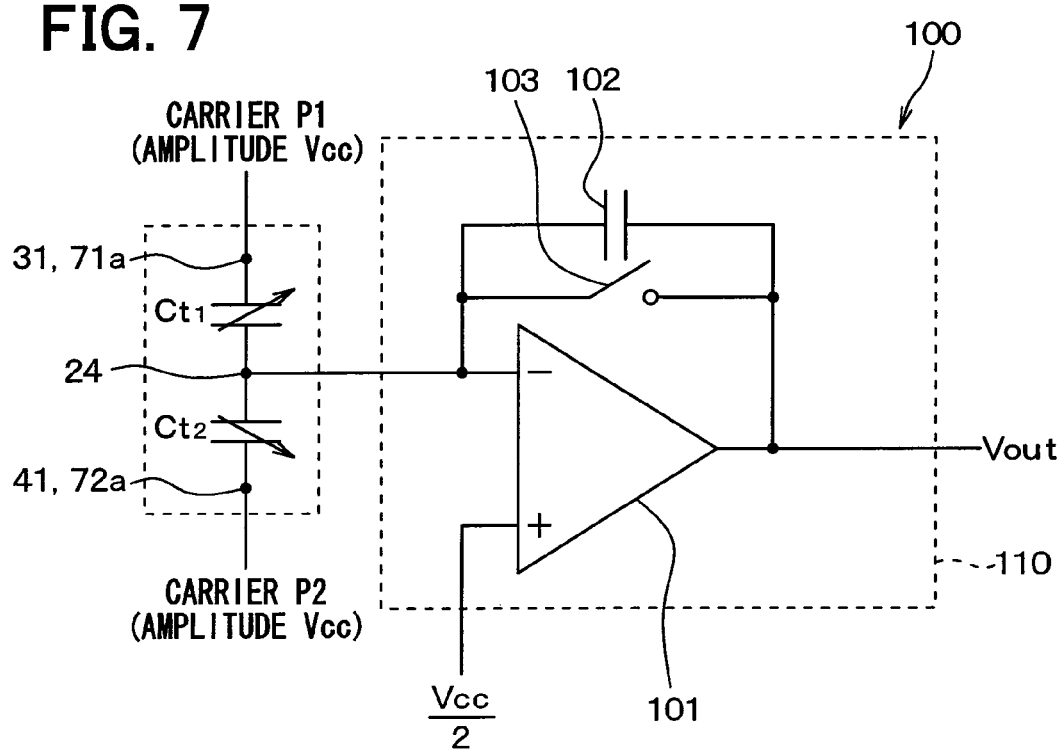
FIG. 7 is a diagram showing a circuit configuration of an acceleration sensor.

The following will describe a circuit configuration of the acceleration sensor with reference to FIG. 7. The sensor part 10 is connected to the circuit 100 illustrated in FIG. 7, and the circuit 100 includes a C-V converter circuit 110 having an operational amplifier 101, a capacitor 102, and a switch 103.

Specifically, the capacitor 102 and the switch 103 are connected in parallel between an inverting input terminal and an output terminal of the operational amplifier 101. In the operational amplifier 101, the inverting input terminal is connected to the movable electrode 24, and a voltage of Vcc/2 (for example, Vcc=5V) is input to a non-inverting input terminal of the operational amplifier 101.

The circuit 100A inputs a first carrier P1 having a pulse waveform to each first fixed electrode 31 and corresponding first auxiliary electrode 71a. The first carrier P1 is oscillated between voltages of Vcc and 0V, and has a predetermined frequency. The circuit 100A inputs a second carrier P2 having a pulse waveform to each second fixed electrode 41 and corresponding second auxiliary electrode 72a. The second carrier P2 is identical in amplitude and frequency with the first carrier P1, and different in phase from the first carrier P1 by 180°.

In FIG. 7, capacitance $C_{t1}$ is configured between each movable electrode 24, and the first fixed electrode 31 and the first auxiliary electrode 71a. The capacitance $C_{t1}$ is a capacitance obtained by summing the capacitance $C_d$ between each movable electrode 24 and the corresponding first fixed electrode 31, and the capacitance $C_s$ between each movable electrode 24 and the corresponding first auxiliary electrode 71a. Similarly, in FIG. 7, capacitance $C_{t2}$ is configured between each movable electrode 24, and the second fixed electrode 41 and the second auxiliary electrode 72a. The capacitance $C_{t2}$ is a capacitance obtained by summing the capacitance $C_d$ between each movable electrode 24 and the corresponding second fixed electrode 41, and the capacitance $C_s$ between each movable electrode 24 and the corresponding second auxiliary electrode 72a. In the circuit 100 of this type, the acceleration is detected when the switch 103 is in the off state, and the capacitor 102 is reset when the switch 103 is in the on state (closed state).

For example, when the acceleration in a direction toward the upper side of the drawing sheet of FIG. 1 is applied to the sensor, the interval between each movable electrode 24 and the corresponding first fixed electrode 31 becomes smaller, and the facing area of the movable electrode 24 and the first auxiliary electrode 71a increases. On the contrary, the interval between each movable electrode 24 and the corresponding second fixed electrode 41 becomes larger, and the facing area of the movable electrode 24 and the second auxiliary electrode 72a decreases. At this time, the capacitances $C_{t1}$ and $C_{t2}$ are represented as the following expressions.

$$C_{t1} = C_d + \Delta C_d + C_s + \Delta C_s \quad \text{(Expression 1)}$$

$$C_{t2} = C_d - \Delta C_d + C_s - \Delta C_s \quad \text{(Expression 2)}$$

In the above expressions, $C_d$ and $C_s$ are initial capacitances, and $\Delta C_d$ and $\Delta C_s$ are acceleration terms corresponding to the acceleration. Therefore, a sensor signal Vout output from the operational amplifier 101 is represented by the following expression when it is assumed that the capacitance of the capacitor 102 is Cf.

$$V_{out} = (C_{t1} - C_{t2}) \times Vcc / Cf \quad \text{(Expression 3)}$$
$$= (2\Delta C_d + 2\Delta C_s) \times Vcc / Cf$$

The following will briefly describe a method of manufacturing the sensor part 10 with reference to FIGS. 8A to 8G. FIGS. 8A to 8G are cross-sectional views taken along a line V-V in FIG. 1.

Figure 8A:
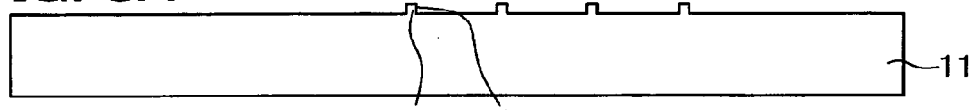
FIGS. 8A to 8G are diagrams showing cross-sectional views illustrating a manufacturing process of the sensor part illustrated in FIG. 1.
Figure 8B:
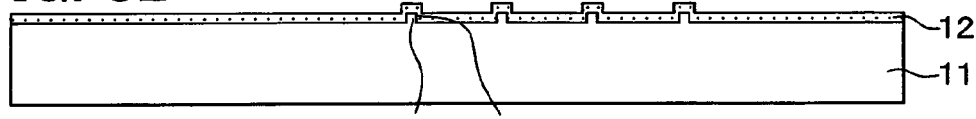

First, as illustrated in FIG. 8A, the support layer 11 is prepared, and recessed portions 11b are defined by etching to provide the protruded portions 11a. As illustrated in FIG. 8B, the first insulating film 12 is disposed on the support layer 11 using a chemical vapor deposition (CVD) technique.

Figure 8C:
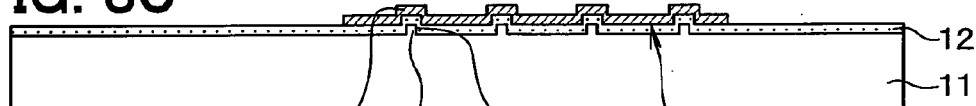

Then, as illustrated in FIG. 8C, a polysilicon or metal film is disposed on the first insulating film 12 using a CVD technique. Then, the first wiring part 71 is formed by selective patterning using a mask, which is not shown. The movable wire 25 and the second wiring part 72 are disposed in another cross-section different from the cross-section shown in FIG. 8C.

Figure 8D:
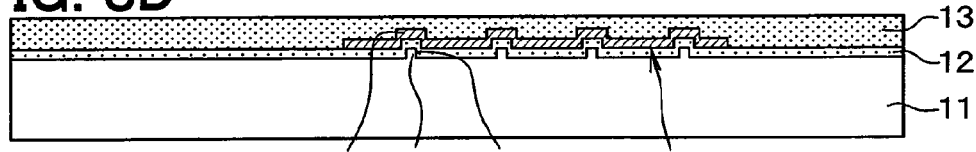

Then, as illustrated in FIG. 8D, the second insulating film 13 is formed using the CVD technique so as to cover the movable wire 25, and the first and second wiring parts 71 and 72. Then, in another cross-section different from the cross-section shown in FIG. 8D, as illustrated in FIGS. 3 and 4, contact holes 13a are defined in parts of portions of the second insulating film 13 in which the anchor part 23a, the first and second support parts 32 and 42, and the connection parts 51 to 53 are disposed.

Figure 8E:
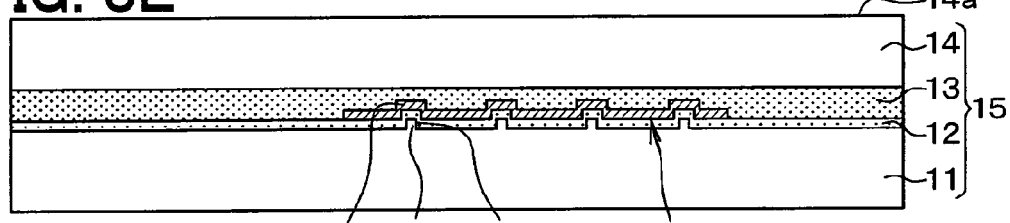

Then, as illustrated in FIG. 8E, the semiconductor layer 14 is formed on the second insulating film 13 using the CVD technique to configure the substrate 15. At this time, in another cross-section different from the cross-section shown in FIG. 8E, as illustrated in FIGS. 3 and 4, the semiconductor layer 14 is embedded in the contact holes 13a. Then, in another cross-section different from the cross-section shown in FIG. 8E, as illustrated in FIG. 4, aluminum is deposited on the semiconductor layer 14, and the aluminum is patterned using a mask for forming the pads 81 to 84.

Figure 8F:
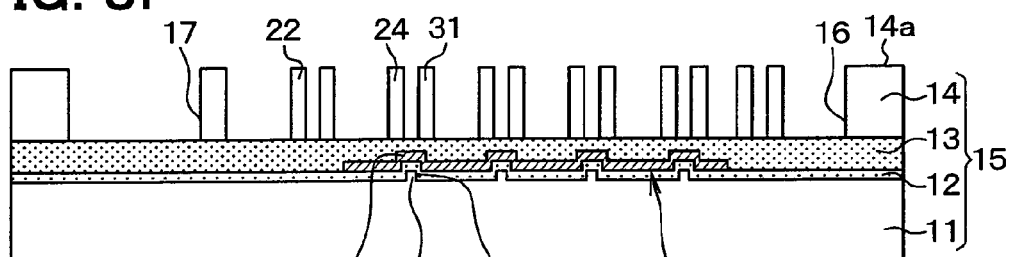

Then, as illustrated in FIG. 8F, with the use of a mask not shown, the first groove portion 16 is defined in the semiconductor layer 14. The movable part 20 and the first and second fixed portions 30 and 40 are partitioned by the groove portion 16. In another cross-section different from that in FIG. 8F, the second groove portion 17 is defined in the semiconductor layer 14, and the connection parts 51 to 53 are partitioned by the groove portion 17.

Figure 8G:
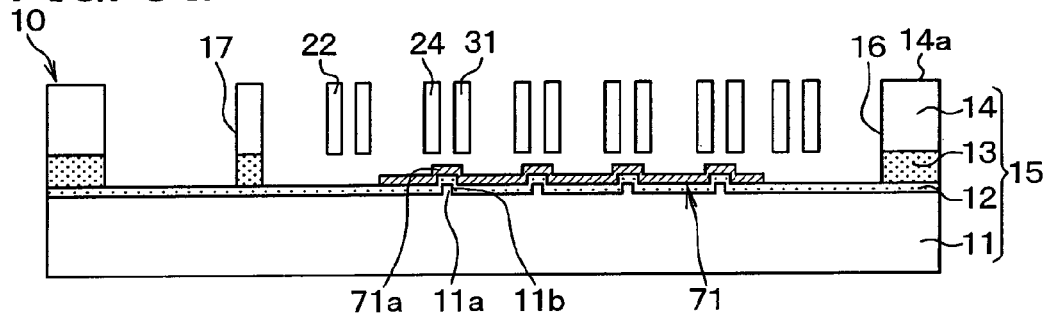

Then, as illustrated in FIG. 8G, predetermined regions of the second insulating film 13 is removed for separating the movable part 20 and the first and second fixed electrodes 31 and 41 from the support layer 11 (first insulating film 12). At the same time, the first and second auxiliary electrodes 71a and 72a are exposed. By above-described process, the sensor part 10 is manufactured.

As described above, in the present embodiment, each facing area between each first auxiliary electrode 71a and the corresponding movable electrode 24 is changed corresponding to a displacement of the movable electrode 24, and each facing area between each second auxiliary electrode 72a and the corresponding movable electrode 24 is changed corresponding to a displacement of the movable electrode 24. The acceleration is detected on the basis of the capacitance $C_d$ between the movable electrodes 24, and the first and second fixed electrodes 31 and 41, and also on the basis of the capacitance $C_s$ between the movable electrodes 24, and the first and second auxiliary electrodes 71a and 72a. This configuration improves the detection sensitivity of the acceleration sensor.

The first and second auxiliary electrodes 71a and 72a are disposed to face only partial portions of the movable electrodes 24. Thus, a variation in the facing area is different corresponding to the displacement direction of the movable electrodes 24, and the displacement direction can be easily determined.

Further, when no acceleration is applied to the sensor, the first and second auxiliary electrodes 71a and 72a face the regions of the movable electrodes 24, which are close to the corresponding first and second fixed electrodes 31 and 41. The corresponding fixed electrode is the fixed electrode which moves toward the movable electrode 24 when the movable electrode 24 is displaced. When certain acceleration is applied to the sensor, a change of the capacitance Cd and a change of the capacitance Cs have the same direction, and the combination of those capacitors with a circuit can be easily implemented.

In the case where no acceleration is applied to the sensor, the first and second auxiliary electrodes 71a and 72a are disposed to face only partial regions of the lower surface 24a of the movable electrodes 24. Herein, the partial regions of the lower surface 24a of the movable electrodes 24 are disposed close to the corresponding first and second fixed electrodes 31 and 41. Herein, suppose that the lower surface 24a is divided into two regions in the direction perpendicular to the displacement direction of the movable electrode 24. With this configuration, in a manufacturing of the sensor part 10 having the above-described configuration, even if the facing areas of the movable electrodes 24, and the first and second auxiliary electrodes 71a and 72a are deviated due to a manufacture error, the movable electrodes 24 can be restricted from being not facing the first and second auxiliary electrodes 71a and 72a.

Further, the interval E1 between the movable electrode 24 and the corresponding first and second auxiliary electrodes 71a and 72a is set to be equal to the interval D1 between the movable electrode 24 and the corresponding first and second fixed electrodes 31 and 41. The interval E2 between the movable electrode 24 and remaining portions of the first and second wiring parts 71 and 72 which are different from the portions configuring the first and second auxiliary electrodes 71a and 72a is set to be equal to the interval D2 between the movable electrode 24, and the non-corresponding first and second fixed electrodes 31 and 41.

With the above-described configuration, a noise caused by the capacitors between the movable electrode 24, and the first and second auxiliary electrodes 71a and 72a can be set to be equal to a noise caused by the capacitors between the movable electrode 24, and the corresponding first and second fixed electrodes 31 and 41. Further, a noise caused by the capacitors between the movable electrode 24 and portions of the first and second wiring parts 71 and 72 which are different from the portions configuring the first and second auxiliary electrodes 71a and 72a can be set to be equal to a noise caused by the capacitors between the movable electrode 24, and the non-corresponding first and second fixed electrodes 31 and 41. By processing the sensor signal Vout using a predetermined noise filter, the noise caused by the capacitor can be easily removed and the detection sensitivity can be further improved.

Second Embodiment

A second embodiment of the present disclosure will be described. In the present embodiment, a cap member is provided to the acceleration sensor according to the first embodiment. Other configurations are identical with those in the first embodiment, and detailed description will be omitted.

Figure 9:
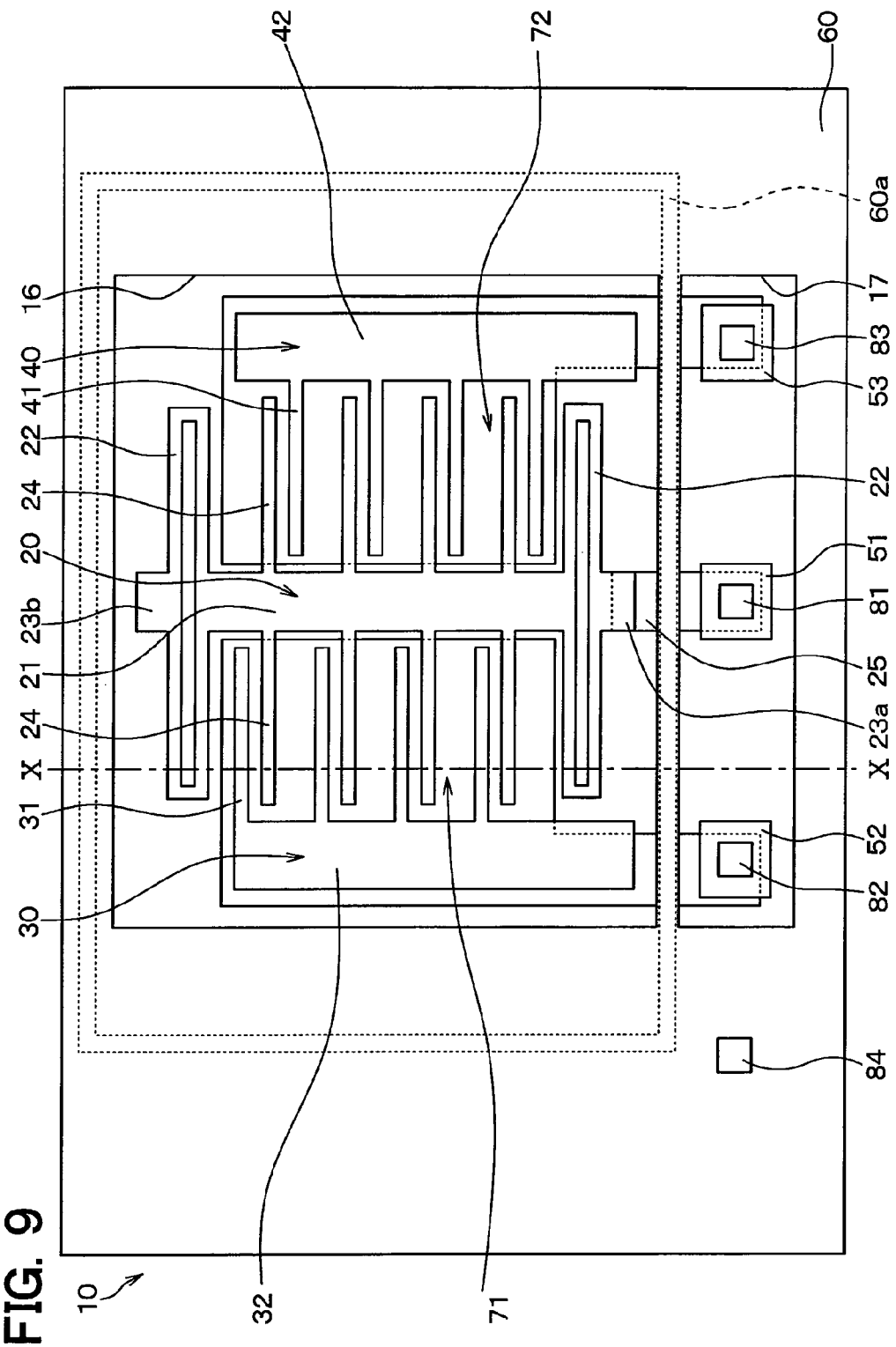
FIG. 9 is a diagram showing a top view of a sensor part of an acceleration sensor according to a second embodiment of the present disclosure.
Figure 10:
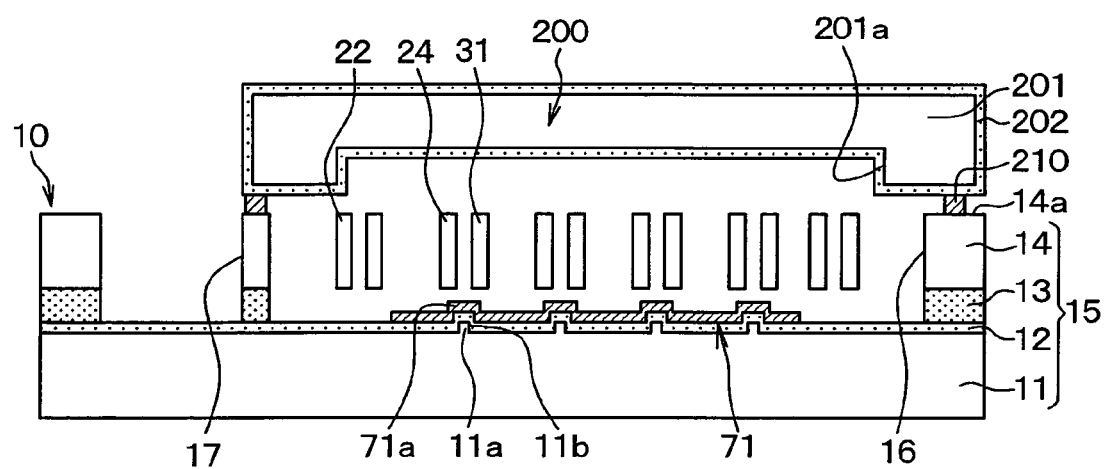
FIG. 10 is a diagram showing a cross-sectional view of the sensor part and a cap member taken along a line X-X in FIG. 9.

As illustrated in FIGS. 9 and 10, in the present embodiment, a cap member 200 is provided in the sensor part 10. The cap member 200 seals the movable electrodes 24, the first and second fixed electrodes 31 and 41, and the first and second auxiliary electrodes 71a and 72a (first and second wiring parts 71 and 72).

Specifically, the cap member 200 has a laminated substrate 201 provided by, for example, a silicon substrate. A recessed portion 201a is defined in a portion of the laminated substrate 201 facing the movable electrodes 24 and the first and second fixed electrodes 31 and 41. An insulating film 202 is disposed on an overall surface of the laminated substrate 201. The insulating film 202 is also disposed on a surface of the recessed portion 201a.

The cap member 200 is joined to a joint part 60a of the peripheral part 60 of the sensor part 10 through a joint member 210. The joint member 210 may be provided by, for example, an oxide film, a low dielectric glass, or metal.

According to the above configuration, similar advantages as those in the above first embodiment can be obtained while a foreign matter is restrained from adhering to the movable electrodes 24, to the first and second fixed electrodes 31 and 41, and to the first and second auxiliary electrodes 71a and 72a.

Third Embodiment

A third embodiment of the present disclosure will be described. In the present embodiment, first and second wiring parts 71 and 72 are disposed in the cap member 200 described in the second embodiment, and the other configurations are identical with those in the second embodiment. Thus, detailed description will be omitted.

Figure 11:
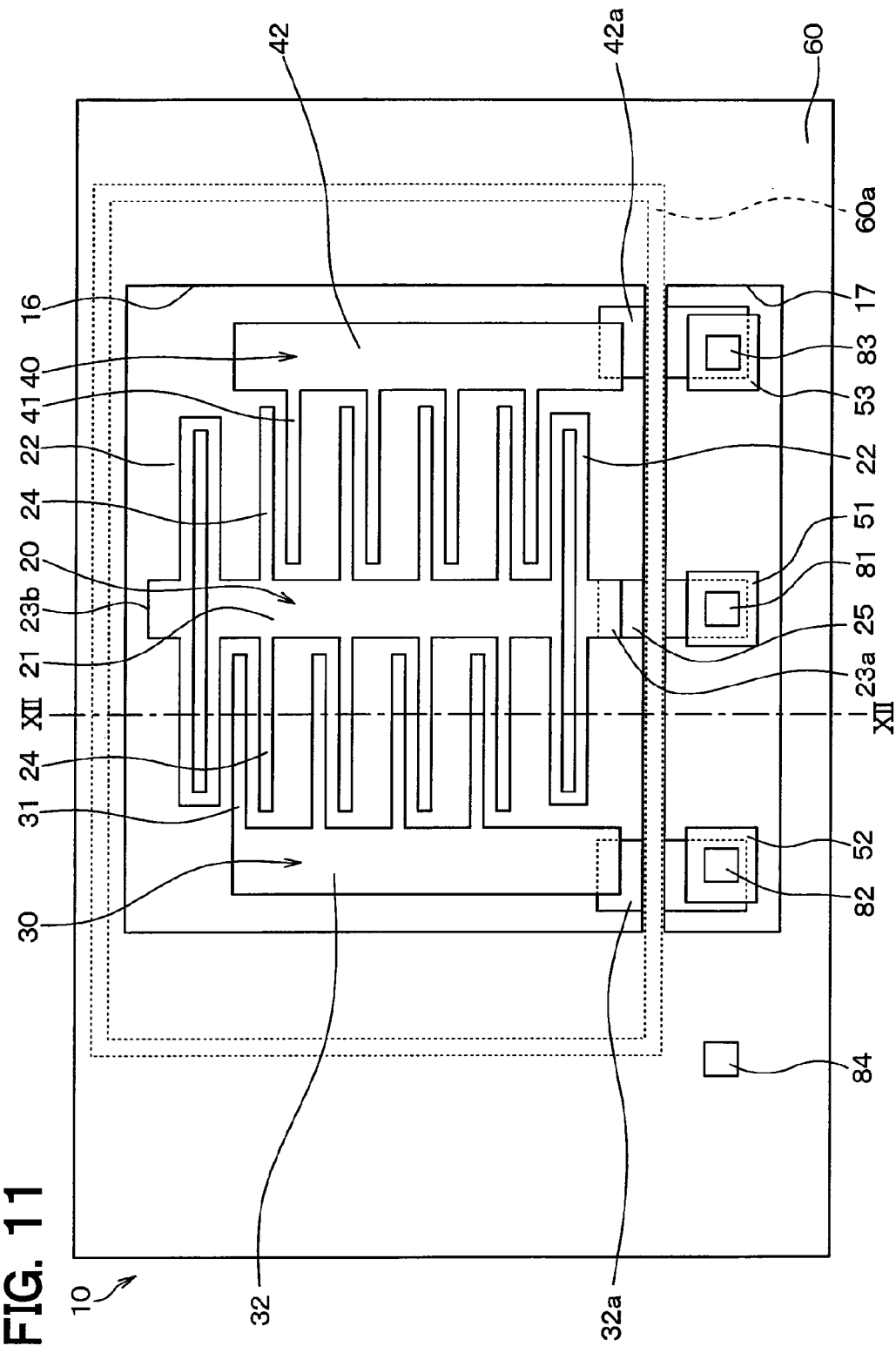
FIG. 11 is a diagram showing a top view of a sensor part of an acceleration sensor according to a third embodiment of the present disclosure.
Figure 12:
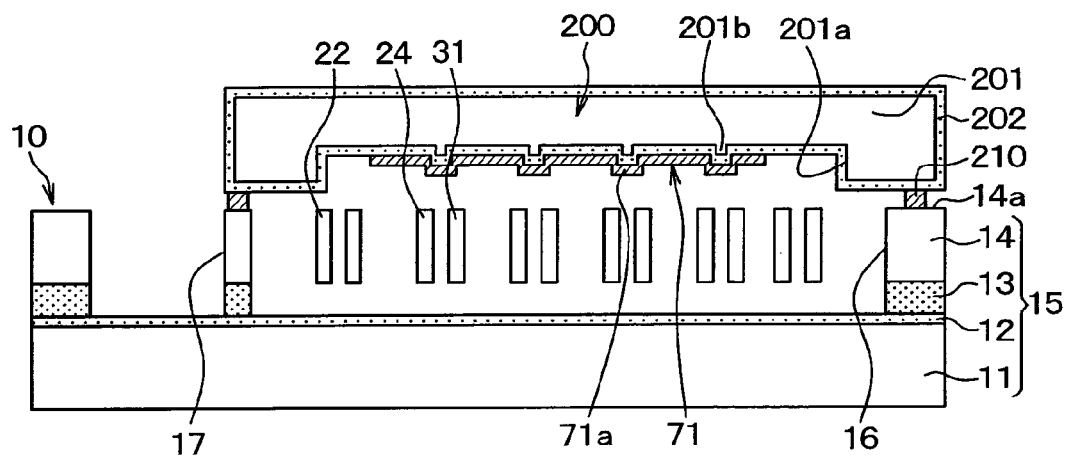
FIG. 12 is a diagram showing a cross-sectional view of the sensor part and a cap member taken along a line XII-XII in FIG. 11.

As illustrated in FIGS. 11 and 12, in the cap member 200 according to the present embodiment, a protruded portion 201b is defined at a bottom portion of the recessed portion 201a of the laminated substrate 201. In other words, in the laminated substrate 201, a part of the recessed portion 201a provides the protruded portion 201b.

The first and second wiring parts 71 and 72 are disposed in portions facing movable electrodes 24, and first and second fixed electrodes 31 and 41 in the insulating film 202. The first and second auxiliary electrodes 71a and 72a are disposed in partial portions of the first and second wiring parts 71 and 72 in which the intervals from the movable electrodes 24 are smaller than the remaining portions of first and second wiring parts 71 and 72. In other words, the first and second auxiliary electrodes 71a and 72a disposed over the support layer 11 through the first insulating film 12 in the second embodiment are disposed on the insulating film 202 in the present embodiment.

The first and second auxiliary electrodes 71a and 72a according to the present embodiment are disposed to satisfy a positional relationship among the movable electrodes 24, the first and second fixed electrodes 31 and 41, and the first and second auxiliary electrodes 71a and 72a described in the first embodiment.

In another cross-section different from that in FIG. 12, penetration electrode parts are disposed in the cap member 200 and are electrically connected with the first and second wiring parts 71 and 72. By the penetration electrode parts, the voltage applied the first fixed electrodes 31 becomes identical to the voltage applied to the first auxiliary electrode 71a, and the voltage applied to the second fixed electrode 41 becomes identical to the voltage applied to the second auxiliary electrode 72a.

Further, first and second fixed portion wires 32a and 42a are disposed on the first insulating film 12 respectively corresponding to the first and second wiring parts 71 and 72. The first and second support parts 32 and 42 are respectively connected to the connection parts 52 and 53 through the first and second fixed portion wires 32a and 42a, respectively.

The first and second fixed portion wires 32a and 42a do not configure capacitances in cooperation with the movable electrodes 24, and perform only a function of connecting the first and second support parts 32 and 42 to the connection parts 52 and 53, respectively. In the present embodiment, the substrate 15 corresponds to a first substrate of the present disclosure, and the laminated substrate 201 corresponds to a second substrate of the present disclosure.

Even if the first and second auxiliary electrodes 71a and 72a are disposed on the cap member 200, the same advantages as those in the second embodiment can be obtained by the present embodiment.

Fourth Embodiment

A fourth embodiment of the present disclosure will be described. The present embodiment is the combination of the second embodiment with the third embodiment, and the other configurations are identical with those in the second embodiment, and detailed description will be omitted.

Figure 13:
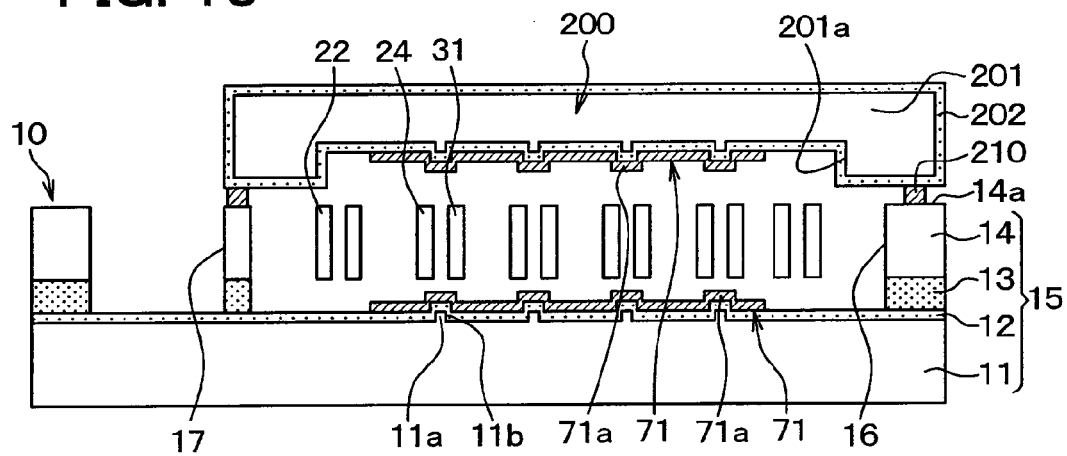
FIG. 13 is a diagram showing a cross-sectional view of a sensor part and a cap member of an acceleration sensor according to a fourth embodiment of the present disclosure.

As illustrated in FIG. 13, in the present embodiment, the first and second auxiliary electrodes 71a and 72a are disposed both on the sensor part 10 and the cap member 200. In the present embodiment, a support layer 11 and a laminated substrate 201 correspond to a second substrate of the present disclosure.

With this configuration, the same advantages as those in the above second embodiment can be obtained while the sensitivity of the acceleration sensor is further improved.

Fifth Embodiment

A fifth embodiment of the present disclosure will be described. The present embodiment is different from the third embodiment in the structures of the sensor part 10 and the cap member 200. Other configurations are identical with those in the third embodiment, and therefore detailed description will be omitted.

Figure 14:
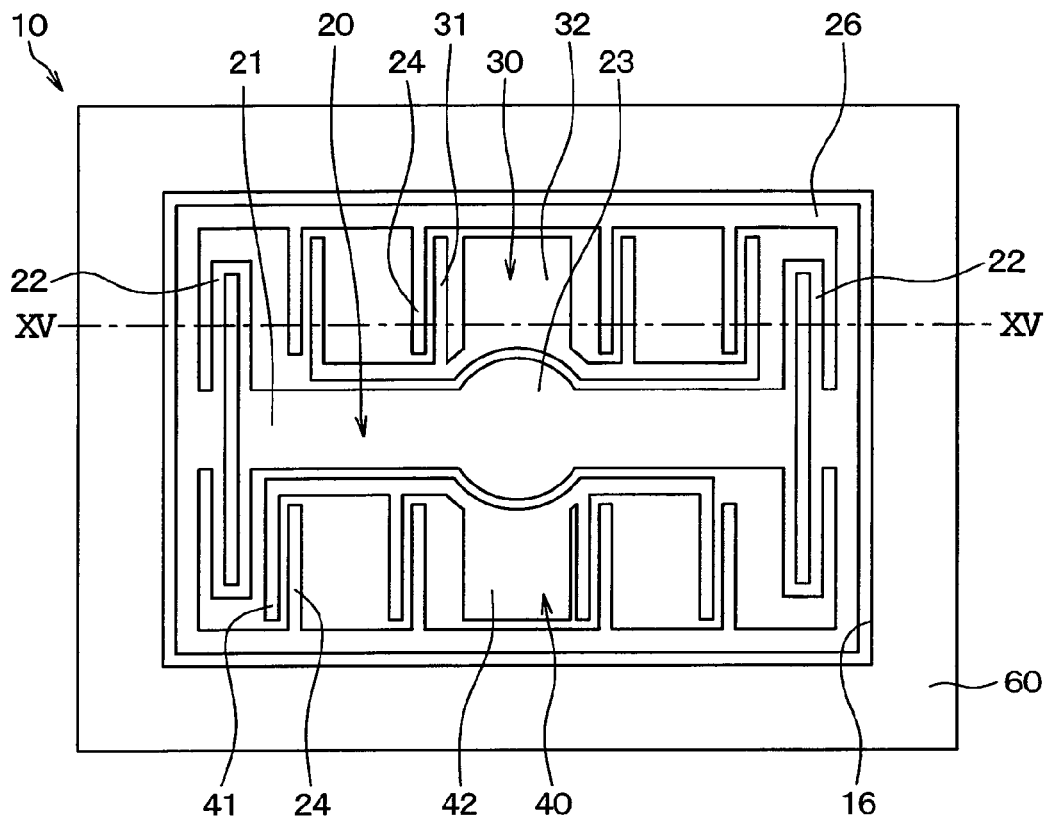
FIG. 14 is a diagram showing a top view of an acceleration sensor according to a fifth embodiment of the present disclosure.
Figure 15:
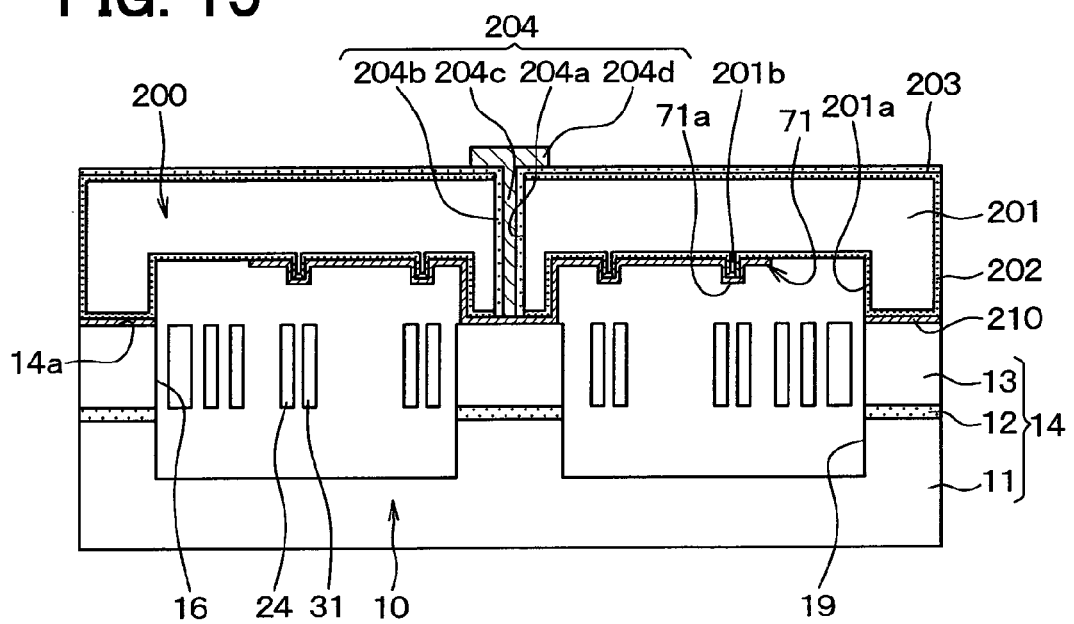
FIG. 15 is a diagram showing a cross-sectional view of a sensor part and a cap member taken along a line XV-XV in FIG. 14.

As illustrated in FIGS. 14 and 15, in the present embodiment, an insulating film 12 is disposed on a support layer, and a semiconductor layer 14 is disposed on the insulating film 12. The substrate 15 includes the support layer 11, the insulating film 12, and the semiconductor layer 14 disposed in order. A recessed portion 19 is defined in portions corresponding to the support layer 11. The recessed portion 19 is also defined in partial portions of the insulating film 12 which correspond to the movable electrodes 24 and the first and second fixed electrodes 31 and 41. The recessed portion 19 prevents the movable electrodes 24, and the first and second fixed electrodes 31 and 41 from coming into contact with the support layer 11.

The movable part 20 is disposed to cross on the recessed portion 19, and is configured so that both ends of a weight part 21 in the longitudinal direction are coupled integrally with a frame part 26 shaped into a rectangular frame through beam parts 22. Similar to the first support part 32 in FIG. 14, the movable part 20 is supported on the support layer 11 through the insulating film 12 at an anchor part 23 located approximately in the center of the weight part 21.

In the cap member 200, a recessed portion 201a is defined in portions of the laminated substrate 201 which face the movable electrodes 24, the first and second fixed electrodes 31 and 41. In the cap member 200, portions facing the anchor part 23 and the first and second support parts 32 and 42 are not recessed.

A first wiring part 71 is disposed in partial portions of the insulating film 202 which face the movable electrodes 24, the first fixed electrodes 31, and the first support part 32. In another cross-section different from that in FIG. 15, a second wiring part 72 is disposed in partial portion of the insulating film 202 which faces the second support part 42, and a wiring part is disposed in partial portion of the insulating film 202 which faces the anchor part 23.

Partial portions of the first and second wiring parts 71 and 72, and the wiring part are connected to the anchor part 23, and the first and second support parts 32 and 42, respectively. A peripheral part 60 in the sensor part 10 is joined to the cap member 200 through the joint member 210.

Further, an insulating film 203 is disposed on an opposite side of the insulating film 202 from the sensor part 10. Three penetration electrode parts 204 (only one is illustrated in FIG. 15) that are electrically connected to wiring parts connected to the first and second wiring parts 71 and 72, and the anchor part 23 are disposed in the cap member 200.

Specifically, each penetration electrode part 204 has a through-hole 204a that passes through the insulating film 203, the insulating film 202, and the laminated substrate 201, and reaches the first and second wire parts 71 and 72. The penetration electrode part 204 further includes a penetration electrode 204c embedded in the through-hole 204a through an insulating film 204b, and a pad 204d electrically connected to the penetration electrode 204c and disposed on the insulating film 203.

The same advantages as those in the above third embodiment can be obtained by the acceleration sensor including the above-described sensor part 10 and the cap member 200 in the present embodiment.

Other Embodiments

The present disclosure is not limited to the above embodiments, but can appropriately change within a scope of the claims.

For example, in the above respective embodiments, the first and second fixed electrodes 31 and 41, and the first and second auxiliary electrodes 71a and 72a may be electrically isolated from each other.

Figure 16:
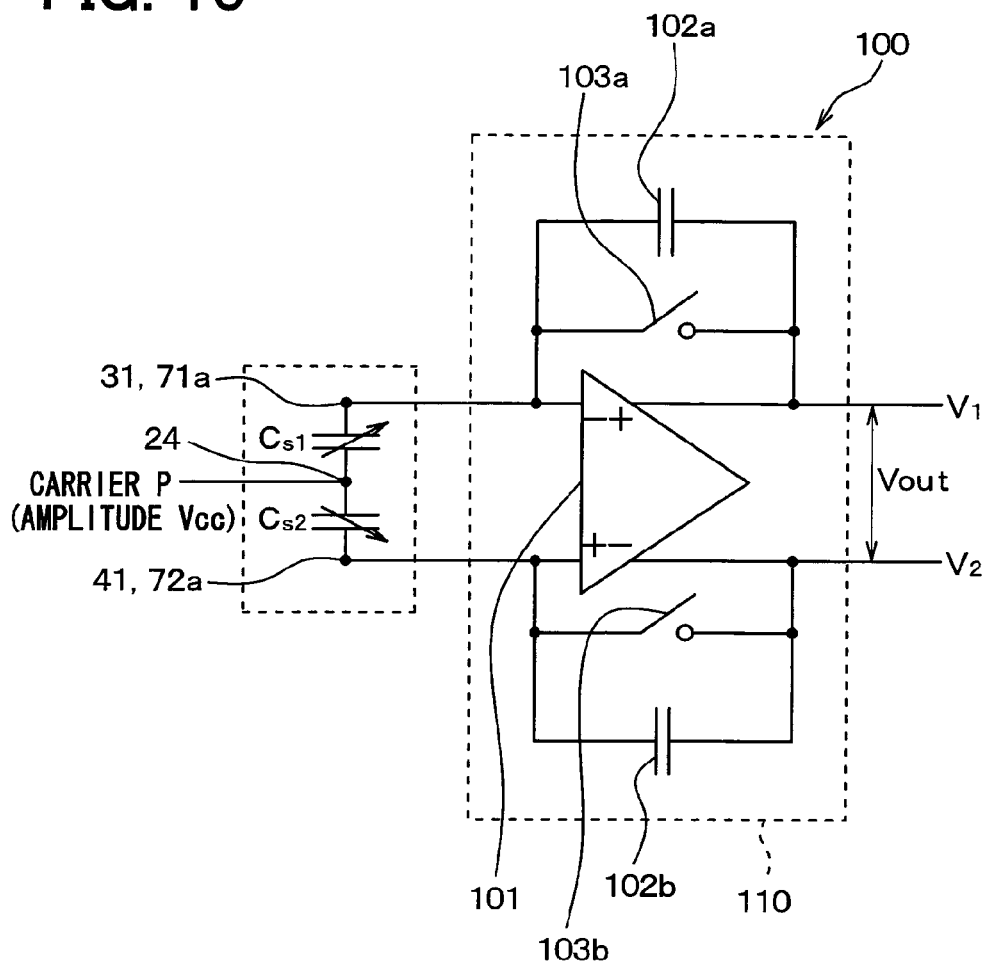
FIG. 16 is a diagram showing a circuit configuration of an acceleration sensor according to another embodiment of the present disclosure.

Further, in the above respective embodiments, as illustrated in FIG. 16, the circuit 100 may be provided with a fully differential C-V converter circuit 110 including the operational amplifier 101, first and second capacitors 102a and 102b, and first and second switches 103a and 103b. In this case, the first capacitor 102a and the first switch 103a are connected in parallel between an inverting input terminal and a positive side output terminal of the operational amplifier 101. The second capacitor 102b and the second switch 103b are connected in parallel between a non-inverting input terminal and a negative side output terminal of the operational amplifier 101. In the operational amplifier 101, the inverting input terminal is connected to the first fixed electrodes 31 and the first auxiliary electrode 71a, and the non-inverting input terminal is connected to the second fixed electrode 41 and the second auxiliary electrode 72a.

A carrier P having a pulse waveform is input to the movable part 20 from the circuit 100. The carrier P is has an amplitude changing between a voltage Vcc and 0V, and has a predetermined frequency.

As described above, a sensor signal Vout (V1-V2) may be output with the use of the fully differential C-V converter circuit 110.

Figure 17:
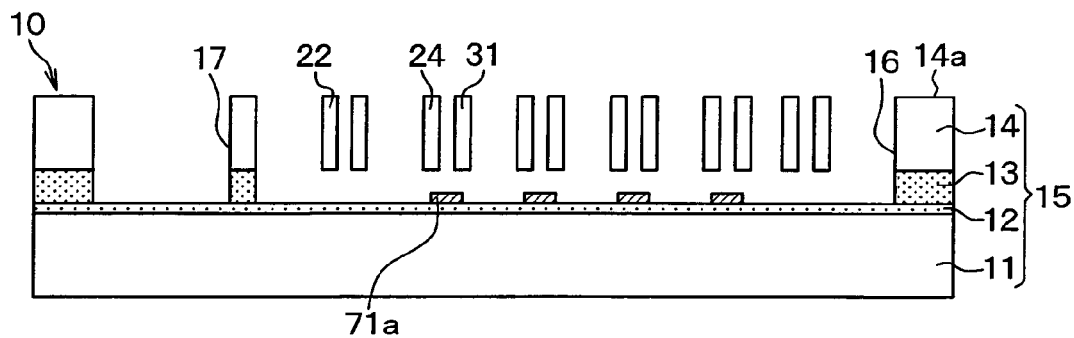
FIG. 17 is a diagram showing a top view of a sensor part of an acceleration sensor according to another embodiment of the present disclosure.

Further, in the above respective embodiments, the protruded portions 11a and 201b may not be disposed on the support layer 11 or the laminated substrate 201. For example, as illustrated in FIG. 17, when the protruded portion 11a is not disposed on the support layer 11, the first and second auxiliary electrodes 71a and 72a may be disposed to face partial portion of the movable electrodes 24, and in another cross-section different from that in FIG. 17, the respective adjacent first and second auxiliary electrodes 71a and 72a may be coupled with each other by the first and second wiring parts 71 and 72.

Further, in the above respective embodiments, the support layer 11 may be made of glass.

In the above respective embodiments, the acceleration sensor is described as an example of the capacitive physical quantity sensor. The present disclosure may also be applied to an angular velocity sensor or a pressure sensor.

Further, the movable electrodes 24, the first and second fixed electrodes 31 and 41, and the first and second auxiliary electrodes 71a and 72a may not satisfy the relationship of the intervals D1, D2, E1, and E2 described in the above first embodiment. Even in such an acceleration sensor, the detection sensitivity can be improved by properly arranging the first and second auxiliary electrodes 71a and 72a.

The invention claimed is:
1. A capacitive physical quantity sensor, comprising:
a first substrate having one surface;
a movable electrode disposed on the one surface of the first substrate and displaceable along the one surface in response to an application of a physical quantity;
a fixed electrode disposed on the one surface of the first substrate and facing the movable electrode, an interval between the fixed electrode and the movable electrode changing in response to a displacement of the movable electrode; and
a second substrate joining with the first substrate, wherein
an auxiliary electrode is disposed on a portion of the second substrate to face the movable electrode, and the auxiliary electrode has a facing area that faces the movable electrode,
the facing area in a case where the movable electrode is displaced in one direction is different from the facing area in a case where the movable electrode is displaced in an opposite direction opposite to the one direction, and
the physical quantity applied in a displacement direction of each of the movable electrodes with respect to the fixed electrode is detected based on both of a first capacitance, which is generated corresponding to the interval between the fixed electrode and the movable electrode, and a second capacitance, which is generated corresponding to an interval between the facing area of the movable electrode and the auxiliary electrode.

2. The capacitive physical quantity sensor according to claim 1, wherein
the auxiliary electrode is disposed to face only a part of the movable electrode.

3. The capacitive physical quantity sensor according to claim 1, wherein
the second substrate is disposed on another surface of the first substrate, which is opposite to the one surface of the first substrate, and
the second substrate supports the first substrate.

4. The capacitive physical quantity sensor according to claim 1, wherein
the first substrate includes a support layer, an insulating film disposed on the support layer and a semiconductor layer disposed on the insulating film, and
the second substrate is disposed on the one surface of the first substrate and seals the movable electrode, the fixed electrode, and the auxiliary electrode.

5. The capacitive physical quantity sensor according to claim 4, wherein
the support layer and the semiconductor layer are made of silicon.

6. The capacitive physical quantity sensor according to claim 1, wherein
the second substrate is disposed on the one surface of the first substrate and seals the movable electrode, the fixed electrode, and the auxiliary electrode,
another second substrate is provided in addition to the second substrate, a second electrode is disposed on an opposite side of the first substrate from the one surface of the first substrate and supports the first substrate, and
the auxiliary electrode is disposed both on the second substrate and on the another second substrate.

7. The capacitive physical quantity sensor according to claim 1, wherein
the movable electrode has a rectangular shape in a cross-section taken along a displacement direction of the movable electrode and has a surface facing the second substrate, and
when the surface of the movable electrode is divided into two regions in a direction perpendicular to the displacement direction of the movable electrode, only one of the two regions faces the auxiliary electrode.

8. The capacitive physical quantity sensor according to claim 1, wherein
a plurality of the movable electrodes are disposed alternately with a plurality of the fixed electrodes,
a wiring part is disposed on the second substrate at portions facing the plurality of the movable electrodes and the plurality of the fixed electrodes,
the wiring part includes a plurality of protruded portions that narrow intervals between the wiring part and the plurality of the movable electrodes,
a plurality of the auxiliary electrodes are provided by the plurality of protruded portions of the wiring part which narrow the intervals between the wiring part and the plurality of the movable electrodes,
an interval between each of the plurality of the auxiliary electrodes and each of the plurality of the movable electrodes is equal to an interval between each of the plurality of the movable electrodes and the corresponding fixed electrode, and
an interval between a remaining portion of the wiring part, which is excluded from the plurality of protruded portions that configuring the plurality of the auxiliary electrodes, and each of the plurality of the movable electrodes is equal to an interval between each of the plurality of the movable electrodes and one of the plurality of the fixed electrodes between which the interval from the movable electrode is increased in response to the application of the physical quantity.

9. The capacitive physical quantity sensor according to claim 1, wherein
the fixed electrode includes a first fixed electrode and a second fixed electrode, an interval between the first fixed electrode and the movable electrode becomes smaller when the movable electrode is displaced in the one direction, and an interval between the second fixed electrode and the movable electrode becomes larger when the movable electrode is displaced in the one direction,
the auxiliary electrode includes a first auxiliary electrode and a second auxiliary electrode, a facing area of the first auxiliary electrode facing the movable electrode becomes larger when the movable electrode is displaced in the one direction, and a facing area of the second auxiliary electrode facing the movable electrode becomes smaller when the movable electrode is displaced in the one direction, and
a difference between a sum of the first capacitance between the movable electrode and the first fixed electrode and the second capacitance between the movable electrode and the first auxiliary electrode, and a sum of a third capacitance between the movable electrode and the second fixed electrode and a fourth capacitance between the movable electrode and the second auxiliary electrode is referred in generation of a sensor signal to be output.

* * * * *